US006933806B2

(12) United States Patent
Maguire et al.

(10) Patent No.: US 6,933,806 B2
(45) **Date of Patent: *Aug. 23, 2005**

(54) ELECTRICAL SIGNAL FILTER WITH SOLDERLESS GROUND CONNECTION

(75) Inventors: Joseph N. Maguire, Syracuse, NY (US); Joseph A. Zennamo, Jr., Skaneateles, NY (US)

(73) Assignee: Eagle Comtronics, Inc., Clay, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/747,856

(22) Filed: Dec. 29, 2003

(65) Prior Publication Data

US 2004/0196118 A1 Oct. 7, 2004

Related U.S. Application Data

(60) Provisional application No. 60/438,742, filed on Jan. 8, 2003.

(51) Int. Cl.[7] .................................................. H03H 7/01
(52) U.S. Cl. ....................................... 333/185; 333/175
(58) Field of Search ................................ 333/175, 167, 333/176, 184, 185

(56) References Cited

U.S. PATENT DOCUMENTS 5,150,087 A * 9/1992 Yoshie et al. ............... 333/185
6,429,754 B1 8/2002 Zennamo, Jr. et al.
6,674,342 B2 * 1/2004 Zennamo et al. ........... 333/175
2002/0186101 A1 * 12/2002 Lamb ......................... 333/185
2002/0196102 A1 12/2002 Zennamo, Jr. et al.
2003/0151470 A1 8/2003 Zennamo, Jr. et al.

* cited by examiner

*Primary Examiner*—Seungsook Ham
(74) *Attorney, Agent, or Firm*—Burr & Brown

(57) ABSTRACT

An electrical signal filter is provided, including a first filter housing member and an abutted second filter housing member that define an internal filter cavity. A circuit board positioned within the filter cavity has at least one plated hole passing from a first surface thereof to an opposed second surface thereof. At least one ground post is also provided, extending away from the inner surface of the first filter housing member and having at least a first portion with an outer dimension that is greater than an inner diameter of the at least one plated ground hole. The circuit board is positioned within the filter cavity such that at least a portion of the ground post extends into the plated hole and engages the surface of the plating to achieve secure ground contact between the circuit board and the first filter housing member in a solderless manner.

46 Claims, 5 Drawing Sheets

ELECTRICAL SIGNAL FILTER WITH SOLDERLESS GROUND CONNECTION

CROSS-REFERENCE TO RELATED APPLICATION

This application claims the benefit of U.S. Provisional Patent Application Ser. No. 60/438,742, filed on Jan. 8, 2003, the entirety of which is incorporated herein by reference.

FIELD OF THE INVENTION

The present invention relates to an electrical signal filter, such as those used in the CATV industry. More particularly, the present invention relates an electrical signal filter having at least one ground post configured to provide electrical contact between the filter housing and a filter component, such as a circuit board, and to enable solderless assembly of the filter housing and components.

BACKGROUND OF THE INVENTION

Various types of electrical signal filters are used in the CATV industry for controlling, on a frequency basis, the propagation of signals through a cable line. In order to reduce production costs and increase manufacturing efficiency, constant strides have been made toward producing electrical signal filters that can be easily assembled by eliminating more costly manufacturing steps, such as precision soldering. Moreover, in an effort to reduce the labor intensive nature of the manufacturing process, focus has also shifted toward producing electrical signal filters using automated manufacturing processes, such as Z-axis manufacturing techniques.

Examples of electrical signal filters that can be assembled, at least in part, using automated Z-axis manufacturing are disclosed in U.S. Pat. No. 6,429,754, issued Aug. 6, 2002, U.S. patent application Ser. No. 10/187,455, filed Jul. 1, 2002, now U.S. Pat. No. 6,647,342, and U.S. patent application Ser. No. 10/329,055, filed Dec. 24, 2002, now U.S. Pat. No. 6,791,436, each assigned to Eagle Comtronics, Inc., the entireties of which are incorporated herein by reference.

The '455 Application and the '055 Application describe a split filter housing that can be vertically assembled using Z-axis assembly methods. The electrical signal filter includes an elongate lower filter housing member and an elongate upper filter housing member that abuts the lower filter housing member at a junction between the lower side surfaces of the upper filter housing member and the upper side surfaces of the lower filter housing member to define an internal filter cavity. Substantially cylindrical (i.e., round in cross-section) ground posts extend upwardly from the inner surface of the lower filter housing member in a direction substantially perpendicular to the longitudinal direction in which the lower and upper filter housing members each extend (e.g., the axial direction of the filter housing members). A circuit board positioned within the filter cavity includes ground holes that are through-plated with a conductive plating material.

The circuit board is placed within the lower filter housing member in the Z-axis manufacturing direction such that ground pins extending from the uppermost end of the ground posts pass through corresponding ground holes and extend above the upper surface of the circuit board. Once the circuit board is properly positioned on the ground posts, the tip portion of ground pin is peened over to form a solderless mechanical and electrical contact between the ground post and the plated ground hole in the circuit board. In this case, the ground pin must be malleable enough to form a good mechanical and electrical contact with the upper surface of the plating after peening.

As the '455 and the '055 Applications describe, the ground pins can also include a recess extending a distance vertically into the ground pins to a position slightly below the upper surface of circuit board to insure that the peened tip portion of the ground pins make good mechanical and electrical contact with the top of the plating material extending out of the ground holes in the circuit board. The recesses in the ground pins assist in the mechanical deformation of the tip portion of the ground pins by allowing the ground pins to break at certain points, depending on the particular shapes of the ground pins and recesses, so that segments of the ground pins will be pressed outwardly and downwardly against the top of the plated ground hole during the peening operation. The recesses in the ground pins can be formed into a variety of different shapes, such as a cross, a Y-shape or an X-shape, to assist deformation during peening and achieve the desired mechanical and electrical connection between the top of the plated ground hole and the deformed (peened) end of the ground pin.

Although the split filter housing described above represents a step in a direction toward realizing automated Z-axis assembly and solderless manufacturing, room for improvement remains. That is, it would be desirable to provide an electrical signal filter that can be assembled using automated Z-axis manufacturing techniques and that further eliminates the need for peening the ground pins to make the solderless connection with the circuit board.

SUMMARY OF THE INVENTION

It is an object of the present invention to provide an electrical signal filter that can be assembled using Z-axis manufacturing techniques and without any soldering steps. Accordingly, one embodiment of the present invention provides an electrical signal filter including a first filter housing member extending along a longitudinal direction from a first end thereof to an opposed second end thereof, and having an inner surface terminating at first and second side surfaces that extend from the first end to the second end, and a second filter housing member extending along the longitudinal direction from a first end thereof to an opposed second end thereof, and having an inner surface terminating at first and second side surfaces that extend from the first end to the second end. The second filter housing member abuts the first filter housing member at a junction between the first and second side surfaces of the second filter housing member and the first and second side surfaces of the first filter housing member, respectively, to thereby define an internal filter cavity.

A circuit board is also provided, positioned within the filter cavity, and having at least one through-hole passing from a first surface thereof to an opposed second surface thereof. Each through-hole is plated with a conductive substance from the first surface of the circuit board to the second surface of the circuit board to form at least one plated ground hole passing through the circuit board from the first surface to the second surface thereof. Further, at least one ground post is provided, extending away from the inner surface of the first filter housing member in a direction substantially perpendicular to the longitudinal direction. Each ground post has at least a first portion with an outer dimension that is greater than an inner diameter of each respective plated ground hole in the circuit board. The circuit board is positioned within the filter cavity such that at least the first portion of each ground post extends into a respective plated ground hole to achieve secure ground contact between the circuit board and the first filter housing member in a solderless manner.

Preferably, each ground post also includes a second portion adjacent a first end of the first portion and having an outer dimension that is greater than the outer dimension of the first portion. The second surface of the circuit board contacts the second portion, and at least part of the first portion extends into the plated ground hole.

It is also preferred that each ground post includes a third portion adjacent a second end of the first portion and having an outer dimension that is less than the outer dimension of the first portion, such that the third portion guides the plated ground hole in the circuit board onto the first portion of each ground post.

Preferably, at least the first portion of each ground post is polygonal, and more preferably, the polygonal portion has a square cross-sectional shape. Although the circuit board can be constructed of a material such as FR-4 (glass-epoxy), which offers a limited degree of flexibility, the size of the ground hole in the circuit board and the outer dimension (i.e., corner-to-corner diagonal dimension of the square) of the first portion of the ground post should be sufficiently dimensioned to prevent damaging the circuit board upon assembly.

It is also preferred that the outer peripheral edge of the through-hole in the circuit board is spaced from a side edge of the circuit board a distance substantially equal to at least one half of the thickness of the circuit board. It is further preferred that the sides of the polygonal first portion of the ground post are arranged parallel to the sides of the circuit board.

Moreover, two ground posts are preferably provided, extending from opposite lateral sides of the inner surface of the first filter housing member and spaced a distance from one another in the longitudinal direction. At least one magnetic isolation shield member can also be provided, interposed between the two ground posts. The shield member includes a surface that is arranged at a height that is substantially the same as the height of the second portions of the ground posts to provide additional support for the circuit board.

The ground post is preferably integrally formed with the first filter housing member, and can be cast, for example, as a part of the first filter housing member.

According to another embodiment of the present invention, an electrical signal filter is provided, including a first filter housing member extending along a longitudinal direction from a first end thereof to an opposed second end thereof, and having an inner surface terminating at first and second side surfaces that extend from the first end to the second end, and a second filter housing member extending along the longitudinal direction from a first end thereof to an opposed second end thereof, and having an inner surface terminating at first and second side surfaces that extend from the first end to the second end. The second filter housing member is positioned to abut the first filter housing member at a junction between the first and second side surfaces of the second filter housing member and the first and second side surfaces of the first filter housing member, respectively, to thereby define an internal filter cavity.

A circuit board is provided, positioned within the filter cavity, and having at least one through-hole passing from a first surface thereof to an opposed second surface thereof. Each through-hole is plated with a conductive substance from the first surface of the circuit board to the second surface of the circuit board to form at least one plated ground hole passing through the circuit board from the first surface to the second surface thereof. At least one ground post is provided, extending away from the inner surface of the first filter housing member in a direction substantially perpendicular to the longitudinal direction. Each ground post has at least a first portion with an outer dimension that is greater than an inner diameter of the plated ground hole. At least one second post member is provided, extending from a first end thereof away from the inner surface of the second filter housing member toward an opposed terminal end thereof in a direction substantially perpendicular to the longitudinal direction. The circuit board is positioned within the filter cavity such that the second post member exerts a force upon the first surface of the circuit board such that at least the first portion of the ground post extends into the plated ground hole to achieve secure electrical grounding contact between the circuit board and the first filter housing member in a solderless manner.

Similar to the above first embodiment, each ground post preferably includes a second portion adjacent a first end of the first portion and having an outer dimension that is greater than the outer dimension of the first portion. The second surface of the circuit board contacts the second portion, and at least part of the first portion extends into the plated ground hole. It is also preferred that each ground post includes a third portion adjacent a second end of the first portion and having an outer dimension that is less than the outer dimension of the first portion, such that the third portion guides the plated ground hole in the circuit board onto the first portion of each ground post.

Each second post member is preferably arranged to be substantially coaxial with a corresponding ground post. It is also preferred that the terminal ends of each second post member further comprises a recess having an inner dimension sufficient to receive the third portion of a corresponding ground post, preferably in a press-fit manner. Further, it is also preferred that the terminal ends of each second post member is spaced from the second portion of the ground post a distance substantially equal to the thickness of the circuit board.

According to another embodiment of the present invention, an electrical signal filter is provided, including a first filter housing member extending along a longitudinal direction from a first end thereof to an opposed second end thereof, and having an inner surface terminating at first and second side surfaces that extend from the first end to the second end, and a second filter housing member extending along the longitudinal direction from a first end thereof to an opposed second end thereof, and having an inner surface terminating at first and second side surfaces that extend from the first end to the second end. The second filter housing member abuts the first filter housing member at a junction between the first and second side surfaces of the second filter housing member and the first and second side surfaces of the first filter housing member, respectively, to thereby define an internal filter cavity.

A circuit board is also provided, positioned within the filter cavity. The circuit board includes at least one through-hole passing from a first surface thereof to an opposed second surface thereof, and at least a portion of the circuit board proximate the through-hole is plated with a conductive substance to form a ground terminal. At least one ground post is provided, extending away from the inner surface of the first filter housing member in a direction substantially perpendicular to the longitudinal direction. Each ground post has at least a first portion having an outer dimension that is greater than an inner diameter of each one through-hole. The circuit board is positioned within the filter cavity such that the first portion of each ground post extends into the through-hole and contacts the ground terminal to achieve secure ground contact between the circuit board and the first filter housing member in a solderless manner.

Preferably, the first portion of the ground post further comprises a plurality of projected edges extending outwardly toward a second portion of the ground post. It is also preferred that the through-hole in the circuit board is not through-plated, and the ground terminal is preferably formed at least on the second surface of the circuit board, such that the plurality of projected edges contact, engage and indent the planar surface of the ground terminal to achieve a secure ground contact between the circuit board and the first filter housing member in a solderless manner. A ground terminal can also be formed on the first surface of the circuit board, as well.

Since the through-holes formed in the circuit board of this embodiment are not through-plated, solder does not tend to accumulate therein when subjected to wave soldering operations during the fabrication of the circuit board itself, prior to filter assembly. Accordingly, the expense associated with various methods for removing excess solder from plated ground holes of the circuit board (before the electrical signal filter can be assembled) is not incurred. Thus, another expensive step is eliminated, and a solderless ground connection is afforded by the present invention.

According to another embodiment of the present invention, at least one second post member extending from a first end thereof away from the inner surface of the second filter housing member toward an opposed terminal end thereof in a direction substantially perpendicular to said longitudinal direction is also provided in addition to the embodiment described immediately above. Preferably, each second post member is substantially coaxial with a respective ground post extending from the first filter housing member. It is also preferred that the terminal end of each second post member includes a recess having an inner dimension sufficient to receive a third portion of a respective ground post that extends toward the second filter housing member a distance beyond the first surface of the circuit board in a press-fit manner. The mechanical relationship between each ground post and second post member enables the secure assembly of the first and second filter housing members with the circuit board interposed therebetween. Thus, an additional soldering step is avoided and assembly of the first and second filter housing members can be accomplished using Z-axis manufacturing techniques.

It is also preferred that the terminal end of each second post member includes a plurality of projected portions extending therefrom and away from the second filter housing member. The plurality of projected portions contact, engage and indent the planar surface of a ground terminal provided on the first surface of the circuit board to achieve mechanical engagement with the circuit board and to provide secure ground contact between the circuit board, a respective ground post and the second filter housing member in a solderless manner.

BRIEF DESCRIPTION OF THE DRAWINGS

For a more complete understanding of the nature and objects of the present invention, reference should be made to the following detailed description of a preferred mode of practicing the invention, read in connection with the accompanying drawings, in which.

DETAILED DESCRIPTION OF THE INVENTION

Figure 1:
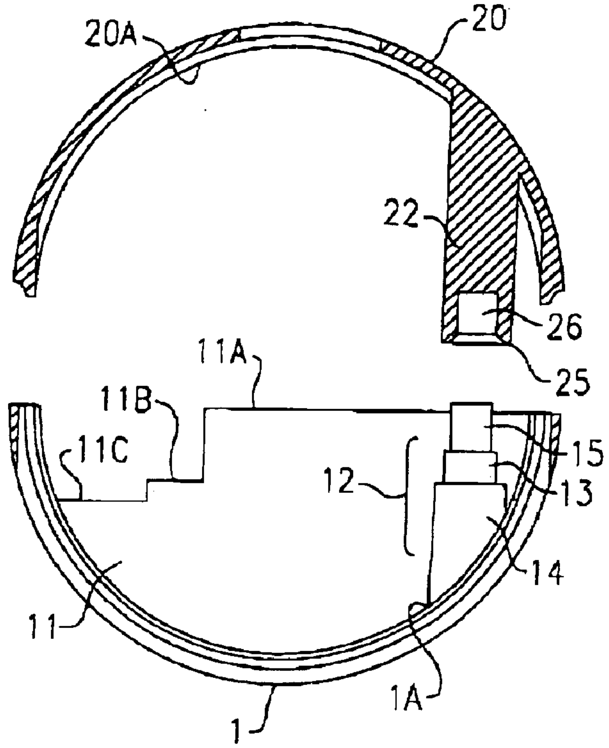
FIG. 1 is a cross-sectional end view of vertically opposed first and second filter housing members according to one embodiment of the present invention.

FIG. 1 is a cross-sectional end view showing vertically opposed first and second filter housing members 1, 20 according to one embodiment of the present invention. As shown, a ground post 12 is positioned proximate the right-hand side of FIG. 1 and extends in a substantially vertical direction (i.e., upward) from an inner surface 1A of the first filter housing member 1. The ground post 12 includes a second portion 14 proximate the inner surface 1A of the first filter housing member 1, a vertically adjacent first portion 13 and a third portion 15 vertically adjacent the first portion 13.

The first filter housing member 1 also includes a shield member 11,to provide magnetic isolation between filter components within the filter housing assembly, for example. The shield member 11 includes a first portion 11A and adjacent stepped portions 11B and 11C. Stepped portion 11C can be dimensioned to function as a spark-gap, as described in U.S. patent application Ser. No. 09/654,593, filed Sep. 1, 2000, now U.S. Pat. No. 6,560,087, the entirety of which is incorporated herein by reference. Stepped portion 11B functions to support part of a circuit board 30 (shown in FIG. 2B). It is preferred that the uppermost distance (e.g., the height) of the surface 11B of the shield member 11 from the inner surface 1A of the first filter housing member 1 is substantially the same as the height of the second portion 14 of the ground post 12.

Figure 2A:
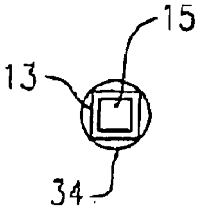
FIGS. 2A–2B are partial top and cross-sectional views of the relationship between the ground post and second post member shown in FIG. 1.
Figure 2B:
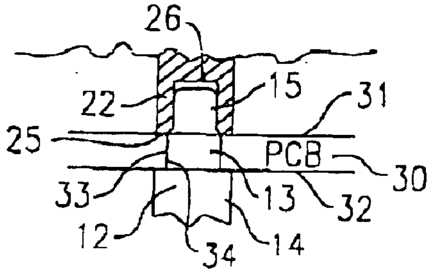

As shown in FIG. 2B, the circuit board 30 includes a first (i.e., upper) surface 31, a second (i.e., lower) surface 32, and a through-hole 33 passing from the first surface 31 to the second surface 32. A portion of the second surface 32 of the circuit board 30 is positioned to contact the support surface 11B of the shield member 11 shown in FIG. 1. The through-hole 33 is plated with a conductive material to form plated ground hole 34, as better shown in FIGS. 3–7. The third portion 15 of the ground post 12 extends beyond the ground hole 34, and the first portion 13 resides within the ground hole 34.

A second post member 22 is positioned proximate the right-hand side of FIG. 1 and extends in a substantially vertical direction (i.e., downward) from an inner surface 20A of the second filter housing member 20 toward a terminal end 25 thereof. A recess 26 is formed in the terminal end 25 of the second post member 22. As shown, preferably the second post member 22 is substantially coaxial with respect to the ground post 12. The recess 26 is sufficiently dimensioned to receive the third portion 15 of the ground post 12 and to provide a press-fit relationship therewith. That is, it is preferred that the recess 26 of the second post member 22 has an inner diameter that is slightly smaller than the outer dimension of the third portion 15 of the ground post 12.

In the orientation shown in FIGS. 1 and 2B, vertical assembly of the filter housing members 1, 20 involves the application of downward force upon the first surface 31 of the circuit board 30 from the terminal end 25 of the second post member 22. The terminal end 25 of the second post member 22 guides the circuit board 30 downward such that the third portion 15 of the ground post 12 is introduced into the ground hole 34 and seats the second surface 32 of the circuit board 30 on the support surface 11B of the shield member 11. The downward force also causes the third portion 15 to pass through the ground hole 34 and a part of the first portion 13 engages the ground hole 34.

As shown, for example, in FIGS. 2A and 2B, the peripheral shape of the first and third portions 13, 15 of the ground post 12 are polygonal (i.e., square), and the shape of the ground hole 34 is substantially circular. FIGS. 2A–2B also show the relationship between the ground post 12 and the second post member 22 and the fit between the first portion 13 of the ground post 12 and the ground hole 34 of the circuit board 30.

The corner-to-corner dimension of the first portion 13 of the ground post 12 is larger than that of the third portion 15. The outer dimension of the first portion 13 is also slightly larger than the inner diameter of the plated ground hole 34 and can be as large as the inner diameter of the through-hole 33. The outer dimension of the first portion 13 of the ground post 12 can also be slightly larger than the inner diameter of the through-hole 33 without causing damage to the circuit board 30 upon assembly, as described in more detail below with reference to FIG. 6.

The above-mentioned dimensional relationship between the first portion 13 of the ground post 12 and the ground hole 34 provides a secure electrical connection between the ground post 12 and the circuit board 30 via the plating. That is, the surface structure of the plating is mechanically engaged by the corners of the adjacent polygonal edges of the first portion 13 of the ground post 12 that extends into the plated ground hole 34. This relationship provides electrical grounding between the first filter housing member 1 and the circuit board 30 via the ground post 12 without the need to include an additional soldering step, as was heretofore conventionally required, and without peening the tip of the ground post 12.

The present invention also offers a mechanical advantage over other methods of assembling split filter housings, in that the relationship between the ground post 12 and the second post member 22 provides a secure press-fit that holds the filter housing members 1, 20 together after vertical assembly is completed. As shown in FIG. 2B, the terminal portion 25 of the second post member 22 is substantially flush against the first surface 31 of the circuit board 30 and circumscribes the ground hole 34. The third portion 15 of the ground post 12 is securely press-fit within the recess 26 of the second post member 22. The second surface 32 of the circuit board 30 is substantially flush against the second portion 14 of the ground post 12. As shown, the terminal end 25 of the second post member 22 is dimensioned to be spaced a distance from the second portion 14 of the ground post 12 by a distance that is substantially equal to the thickness, t, of the circuit board 30 in order to facilitate the above-described press-fit mechanically secure relationship upon assembly. Thus, an additional soldering step is avoided and assembly of the first and second filter housing members 1, 20 can be accomplished using Z-axis manufacturing techniques.

Figure 3:
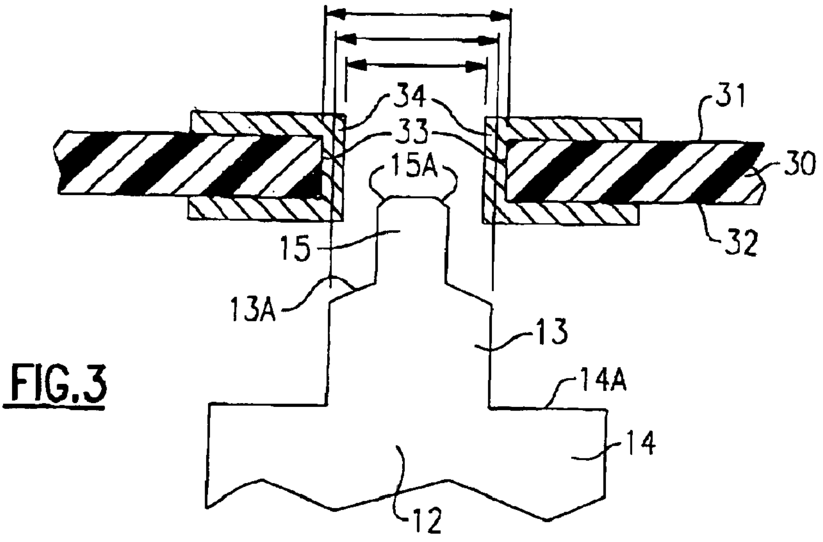
FIG. 3 is a cross-sectional view showing the relationship between the portions of the ground post and the plated ground hole in the circuit board according to one embodiment of the present invention.
Figure 4:
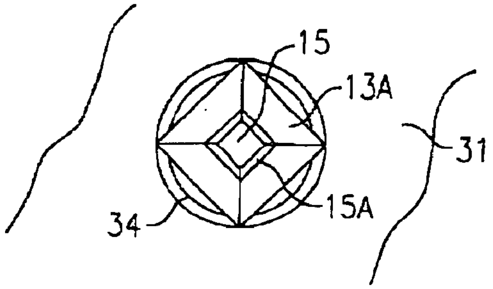
FIG. 4 is a partial top view of the circuit board, the ground post and the plated ground hole shown in FIG. 3.

FIG. 3 is a cross-sectional view showing a dimensional relationship between the portions of the ground post 12 and the plated ground hole 34 of the circuit board 30 according to another embodiment of the present invention. FIG. 4 is a partial top view of the first surface 31 of the circuit board 30, the ground post 12 and the plated ground hole 34 shown in FIG. 3. FIGS. 3 and 4 are best read in conjunction with FIG. 5, which is a cross-sectional view showing the dimensional relationship between the portions of the ground post 12, the plated ground hole 34 of the circuit board 30, the terminal portion 25 of the second post member 22 and the recess 26 of the second post member 22.

As shown in FIG. 3, the ground post 12 includes three portions of varying outer dimensions. The second portion 14 has an outer dimension that is larger than that of the first portion 13, whose outer dimension is larger than that of the third portion 15. As mentioned above, it is preferred that at least the first and third portions 13, 15 of the ground post 12 are polygonal in shape, and preferably square, such that the outer dimension is measured as a corner-to-corner diagonal dimension. The second portion 14 can be formed to have any desired peripheral shape, so long as the surface 14A is sufficient to seat the lower surface 32 of the circuit board 30 upon assembly of the filter housing members 1, 20 shown in FIG. 1.

Small sections of the leading edges 13A of the first portion 13 are tapered, as are sections of the leading edges 15A of the third portion 15. Similarly angled tapered sections are formed on the lowermost portion of the inner peripheral edge 26A of the recess 26 of the second post member 22 (see FIG. 5). The tapered sections 15A smoothly guide the third portion 15 of the ground post 12 through the plated ground hole 34 and into the recess 26 of the second post member 22 to provide a press-fit therewith, as described below. The tapered sections 13A guide the first portion 13 into the plated ground hole 34 to engage in the above-described mechanical interference fit with the periphery of the inner diameter thereof.

The outer dimension of the third portion 15 is slightly smaller than the inner diameter of the plated ground hole 34 such that the third portion 15 will extend therethrough without significant interference and extend a distance beyond the first surface 31 of the circuit board 30.

As mentioned above, the through-hole 33 is plated with conductive plating from the first surface 31 to the second surface 32 thereof (see FIG. 3) to form the plated ground hole 34. The outer dimension of the first portion 13 of the ground post 12, as shown, is preferably greater than the inner diameter of the plated ground hole 34 but slightly less than the inner diameter of the through-hole 33 itself. This is desired in order to prevent the circuit board 30 from cracking, splitting or otherwise incurring damage when the ground post 12 is inserted therethrough. Although the figures are not drawn exactly to scale, it should be noted that the actual thickness dimension of the plating is on the order of 1 to 10 thousandths of an inch. Thus, precision sizing of the portions of the ground post 12 are preferred according to this embodiment of the present invention.

While the first portion 13 engages in the above-described mechanical interference fit with the plated ground hole 34, the third portion 15 engages the recess 26 of the second post member 22 in a secure press-fit relationship. That is, the outer dimension of the third portion 15 is sufficiently larger than the inner diameter of the recess 26, and upon assembly, the vertical force applied by the second post member 22 guides the ground hole 34 of the circuit board 30 over the third portion 15 and further onto the first portion 13 while the third portion 15 is received in the recess 26.

Tests have shown, however, that properly dimensioning and arranging the through-hole 34 with respect to the circuit board 30 facilitates using a ground post 12 having a first portion 13 whose outer dimension is actually the same size or even slightly larger than the diameter of the though-hole 33 itself without causing any damage to the circuit board 30. This is described in more detail below with reference to FIG. 6.

Figure 6:
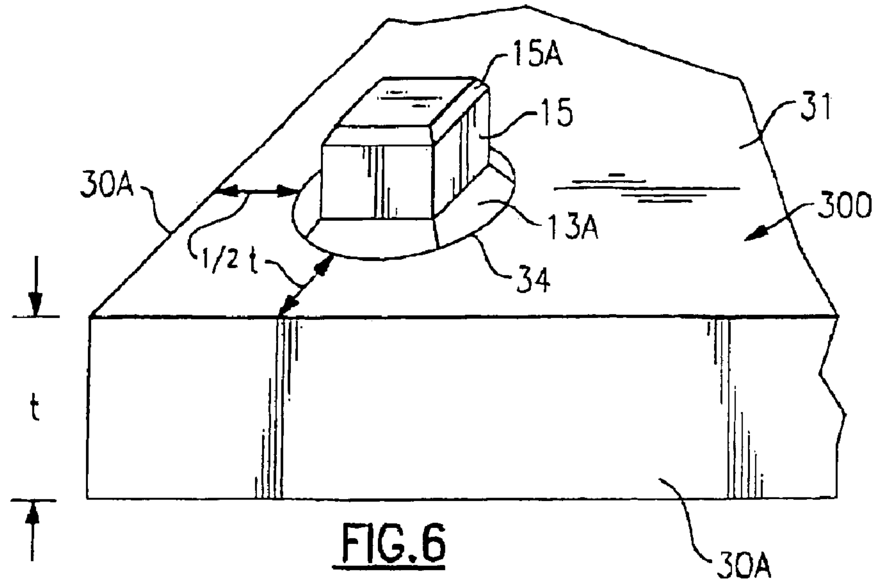
FIG. 6 is a partial perspective view of a circuit board showing a preferred distance between adjacent edges of the circuit board and the peripheral edges of a through-hole formed therein.

FIG. 6 is a partial perspective view showing a preferred distance between the outer peripheral edge of a through-hole 33 and the edges 30A of a circuit board 30. In order for the circuit board 30 to be able to withstand the forces exerted thereon when the outer dimension of first portion 13 of ground post 12 inserted into the plated ground hole 34 is slightly larger than the inner diameter of the through-hole 33 itself, the through-hole 33 should be formed in a portion of the circuit board 30 that will not encourage damage. As shown, the outer peripheral edge of the through-hole 33 should be spaced from the adjacent edges 30A of the circuit board 30 a distance that is at least one-half the thickness dimension, t, of the circuit board 30.

FIG. 6 also shows the preferred orientation of the polygonal sides of the post member 12 with respect to the adjacent edges 30A of the circuit board 30. That is, as shown, the flat sides of the first and third portions 13, 15 should run in a direction that is parallel to the adjacent edges 30A of the circuit board 30. This preferred orientation also contributes to the ability of the plated ground hole 34 to best receive the first portion 13 of ground post 12 that has an outer dimension that is slightly larger than the inner diameter of the through-hole 33 itself without damaging the circuit board 30. Rotating the orientation of the sides of the ground post 12 such that they do not run in a parallel direction with respect to the edges 30A of the circuit board 30 introduces the opportunity for stress gradients caused by the ground post 12 corner tips to increase the likelihood of damage to the circuit board 30 upon assembly.

Figure 7:
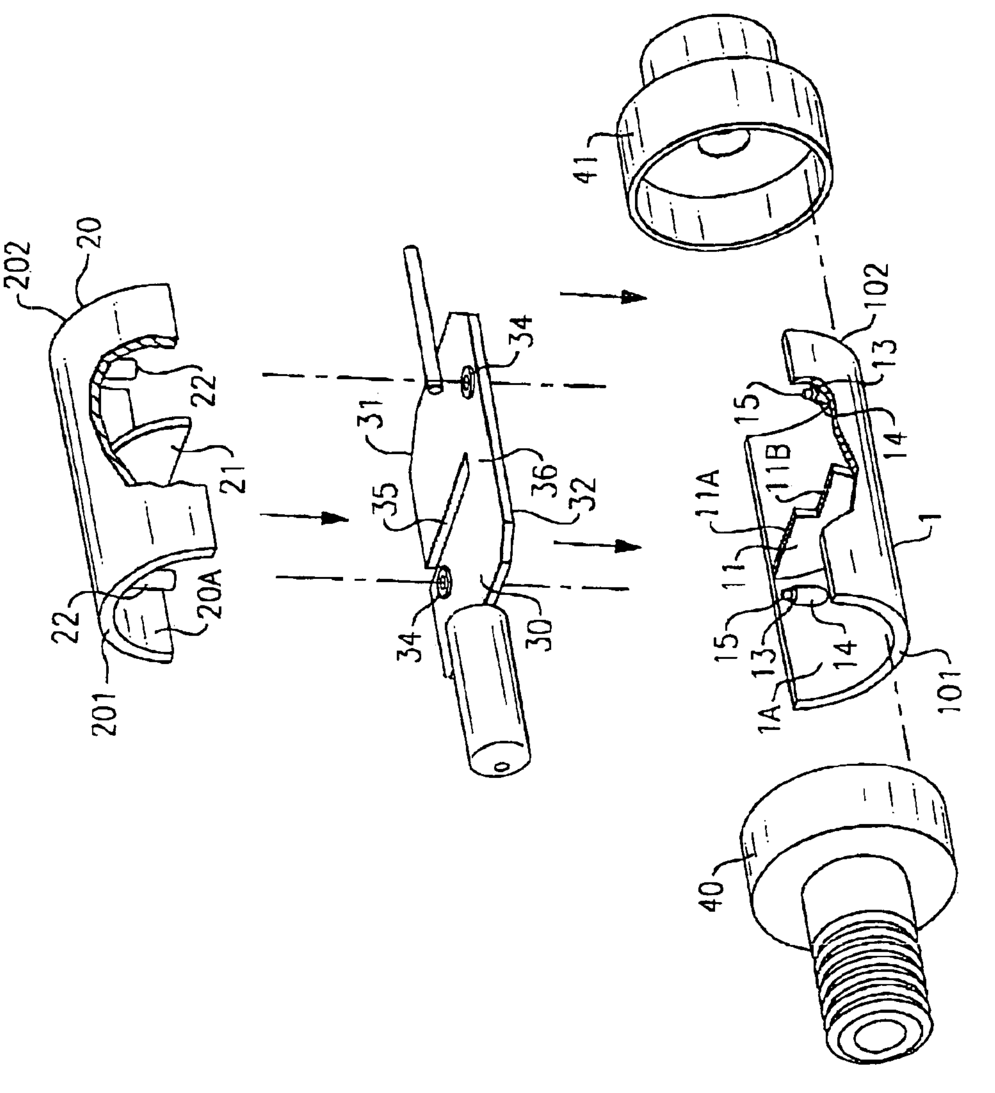
FIG. 7 is an exploded view of a filter assembly according to one embodiment of the present invention.

FIG. 7 is an exploded view of a split filter housing assembly according to another embodiment of the present invention. Like reference numerals have been assigned to like components described above with reference to FIGS. 1–6, and additional recitation of previously described features has been omitted.

The second filter housing member 20 includes a shield member 21 extending radially and vertically (downwardly, as shown) from the inner surface 20A thereof. The shield member 21 is positioned to longitudinally and vertically correspond to the location of the shield member 11 of the first filter housing member 1 and with the position of a receiving slot 35 formed in the circuit board 30. The circuit board 30 includes a pair of opposed through-holes 33 formed on opposite lateral sides of the circuit board 30 and on either side of the slot 35. Each through-hole 33 is plated with conductive plating from the first surface 31 to the opposed second surface 32 of the circuit board 30 to form plated ground holes 34.

A pair of second post members 22 extend vertically (i.e., downwardly) from the inner surface 20A on opposite lateral sides of the second filter housing member 20 and on either side of the shield member 21. A pair of ground posts 12 extend vertically (i.e., upwardly) from the inner surface 1A on opposite lateral sides of the first filter housing member 1 on either side of shield member 11. The respective positions of the ground posts 12 and second post members 22 preferably correspond such that, upon assembly, each of the ground posts 12 will be substantially coaxial with a corresponding one of the second post members 22.

The shield member 11 extending radially and vertically (upward, as shown) from the inner surface 1A of the first filter housing member 1 includes a first surface 11A and an adjacent stepped surface 11B on which a portion 36 of the circuit board 30 sits upon assembly. A third stepped surface adjacent stepped surface 11B can also be provided, as described above with respect to the third stepped portion 11C shown in FIG. 1.

FIG. 7 also shows first and second end caps 40, 41. After the first and second filter housing members 1, 20 are vertically assembled as described above, end cap 40 is positioned proximate the first ends 101, 201 of the assembled filter housing members 1, 20, and the second end cap 41 is positioned proximate the second ends 102, 202 of the assembled filter housing members 1, 20. Thus, the circuit board is captive within the internal cavity created by the abutted first and second filter housing members 1, 20 and closed off by the end caps 40, 41. These end caps 40, 41 can be assembled without the need for solder according to the description included in the above-incorporated '455 and '055 Applications.

Figure 8:
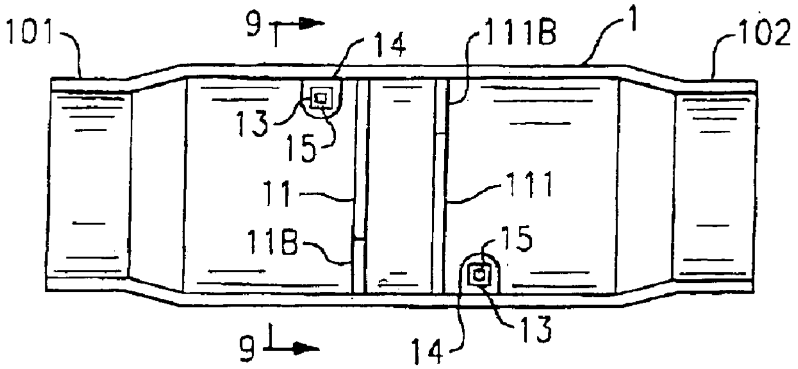
FIG. 8 is a top view of a first filter housing member according to another embodiment of the present invention.
Figure 9:
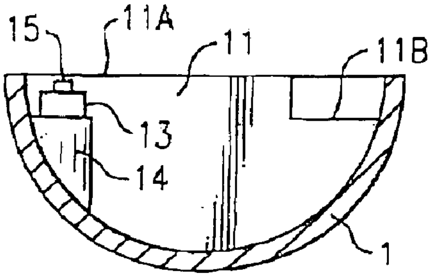
FIG. 9 is an end-view of the first filter housing member shown in FIG. 8 taken through line 9—9.

FIG. 8 is a top view of a first filter housing member 1 according to another embodiment of the present invention, and FIG. 9 is an end view of the first filter housing member 1 taken through line 9—9 in FIG. 8. The embodiment of FIGS. 8 and 9 differs from the embodiment shown in FIG. 7 in that the first filter housing member 1 includes a pair of shield members 11, 111. The ground posts 12 are positioned on the opposite outer most sides of the shield members 11, 111 on opposite lateral sides of the inner surface 1A of the first filter housing member 1. Each of the shield members 11, 111 is provided with a stepped portion 11B, 111B on which a portion of a circuit board (not shown) sits upon assembly. Again, the height of the stepped portions 11B, 111B should substantially correspond to the height of the second portion 14 of the ground posts 12 to properly support the circuit board 30 within the filter housing assembly.

Although it is not shown in the drawings, in order to properly fulfill this embodiment of the present invention, a corresponding pair of shield members should be provided on the second filter housing member 20, and the circuit board should be configured with a slot arrangement sufficient to accommodate the double shields. This type of multiple shield arrangement is described, for example, in the previously herein incorporated ’455 and ’055 Applications, as well as in U.S. Pat. No. 6,429,754, also previously incorporated herein by reference.

Figure 10A:
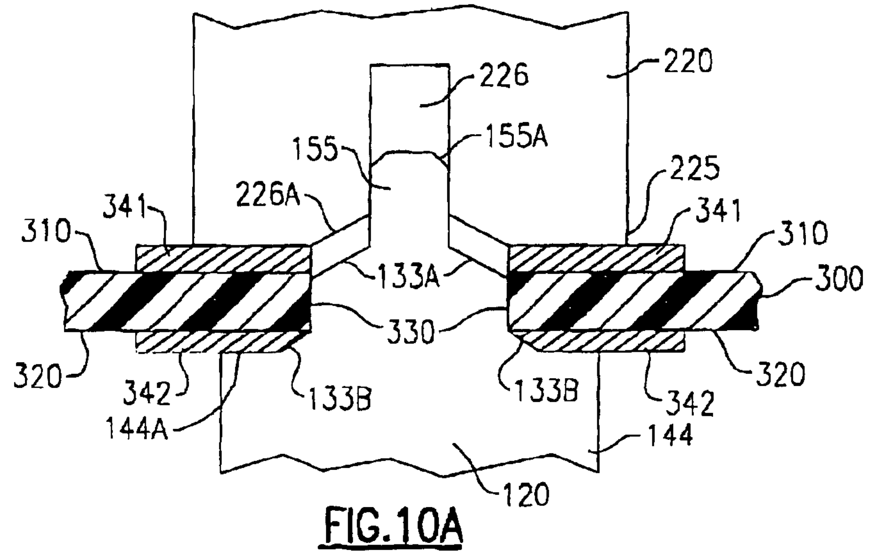
FIG. 10A is a cross-sectional view showing the relationship between the portions of the ground post, the ground terminal proximate the non-plated through-hole on the second surface of the circuit board, the terminal portion of the second post member, the ground terminal proximate the non-plated through-hole on the first surface of the circuit board and the recess of the second post member according to another embodiment of the present invention.

FIG. 10A is a cross-sectional view showing the ground contact formed between the projected edges 133B of the first portion 133 of the ground post 120 and the plating that forms the ground terminal 342 on the second surface 320 of the circuit board 300 proximate the non-plated through-hole 330 according to another embodiment of the present invention. In addition to the structure of the ground post 12 shown in FIG. 3 and described above, the first portion 133 of the ground post 120 includes a plurality of projecting edges 133B extending outwardly toward the surface 144A of the second portion 144. Unlike the tapered sections 133A and 155A, which function much in the same way as the tapered sections 13A and 15A described above with reference to FIGS. 3 and 5, the projected edges 133B do not extend from the entire outer periphery of the first portion 133.

Figure 11A:
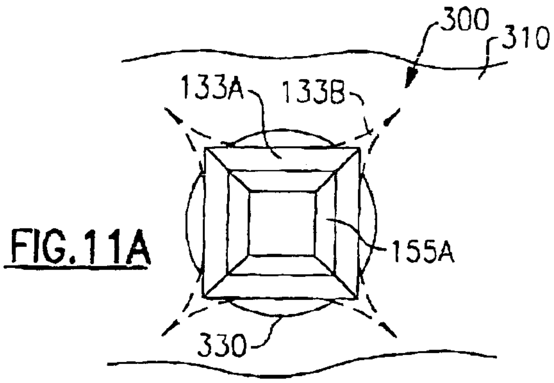
FIG. 11A is a partial top view of the ground post and circuit board shown in FIG. 10A.

As shown in FIG. 11A, the projected edges 133B are relatively sharply angled, fin-like extensions of the corner portions of the polygonal (i.e., square) first portion 133. Upon assembly, the projected edges 133B engage and indent the planar surface of the ground terminal 342 on the second surface 320 of the circuit board 300 in the vicinity of the non-plated through-hole 330. In that manner, and as shown in FIG. 10A, secure ground contact between the first filter housing member 1 and the circuit board 300 is achieved in a solderless manner. The manner in which the solderless ground contact is achieved is different from the solderless manner in which the ground post 12 interacts with the plated ground hole 34 in the embodiments shown in FIGS. 1–9, however, in that this embodiment affords additional benefits by providing ground terminals on both surfaces 310 and 320 of a circuit board 300 rather than employing a plated ground hole.

That is, since the through-hole 330 itself is not through-plated with a conductive material, the expense associated with various methods for evacuating excess solder accumulated in plated ground holes during wave soldering steps involved in the fabrication of the circuit board itself are eliminated. Thus, the present invention offers reduced production cost and increased manufacturing efficiency by eliminating these additional steps.

Figure 10B:
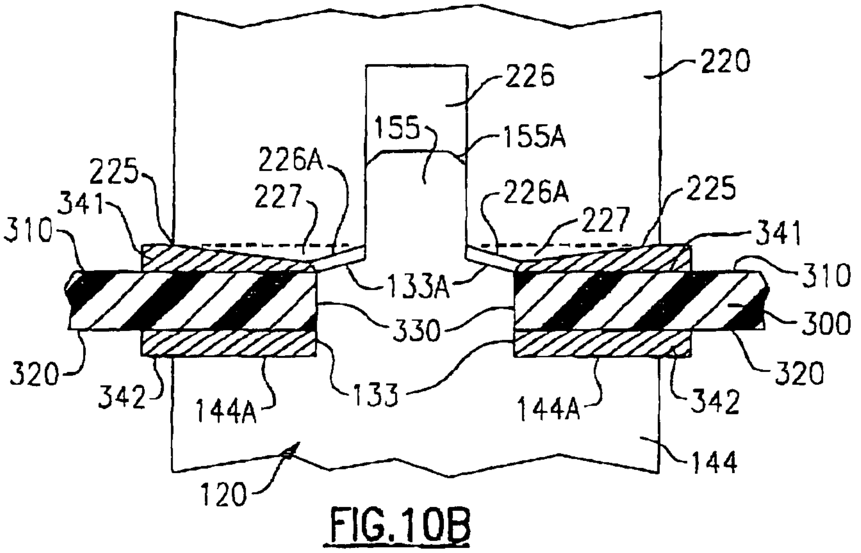
FIG. 10B is a cross-sectional view of the structure of FIG. 10A shown rotated about 45° with respect to a central axis of the ground post and the second post member.

FIG. 10B is a cross-sectional view of the structure of FIG. 10A shown rotated about 45° with respect to the substantially coaxial central axes of the ground post 120 and the second post member 220. In addition to the structure of the second post member 22 described above and shown in FIGS. 1 and 5, for example, the terminal end 225 of the second post member 220 includes a planar portion and a plurality of projected portions 227 extending downwardly and slightly outwardly therefrom. As shown in FIG. 10B, the projected portions 227 are formed in a substantially pyramidal shape, wherein a first side face of the pyramid is defined by an extension of the angled lowermost portion of the inner peripheral edge 226A of the recess 226, the base of the pyramid is defined by the planar portion of the terminal end 225, and the other two faces are angled surfaces extending from and beyond the planar surface of the terminal end 225 which join with the first side face in a point.

Figure 11B:
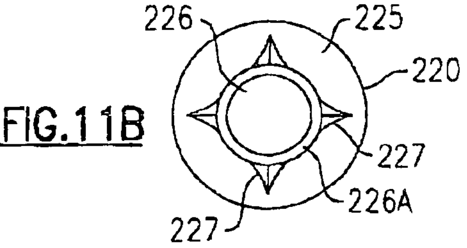
FIG. 11B is a partial bottom view of the second post member and the circuit board shown in FIG. 10B.

FIG. 11B is a partial bottom view of the second post member 220 and the circuit board 300, shown rotated approximately 45° about the central axis of the second post member 200 and with respect to the view shown in FIG. 11A. As shown, the projected portions 227 are relatively sharply angled members extending from the terminal end 225 of the second post member 220. Upon assembly, the projected portions 227 contact, engage and indent the planar surface of the ground terminal 341 on the first surface 320 of the circuit board 300 in the vicinity of the non-plated through-hole 330. In that manner, and as shown in FIG. 10B, secure ground contact between the second filter housing member 20, the circuit board 300 and the ground post 120 is achieved in a solderless manner.

In FIGS. 10A and 10B, the dimensions of the portions of the ground post 120 correspond to the dimensions of the through-hole 330 and the recess 226 formed in the second post member 220 in substantially the same manner as described above with reference to FIG. 5. The polygonal edges 133B of the first portion 133 of the ground post 120, however, extend outwardly toward the second portion 144 as described above. Also, as shown in the rotated view of FIG. 10B, the projected portions 227 extend downwardly and slightly outwardly from the terminal end 225 of the second post member 220, as described above.

As shown in FIG. 10A, the ground connection between the circuit board 300 and the first filter housing member 1 (see, for example, FIG. 7) from which the ground post 120 extends, is achieved, in part, via the interference fit between the projected edges 133B of the first portion 133 of the ground post 120 that contact, engage and indent the planar surface of the ground terminal 342 formed on the second surface 320 of the circuit board 300. Mechanical engagement between the second surface of the circuit board 300 and the projected edges 133B of the ground post 120 is also provided.

As shown in FIG. 10B, a ground connection between the circuit board 300 (the ground terminal 341 on the first surface thereof), the second filter housing member 20 and the ground post 120 is also achieved, in part, via the interference between the projected portions 227 of terminal end 225 of the second post member 220 that contact, engage and indent the planar surface of the ground terminal 341 formed on the first surface 310 of the circuit board 300. In that manner, and by virtue of the secure press-fit relationship between the third portion 155 of the ground post 120 within the recess 226 of the second post member 220 upon assembly, the two ground terminals 341, 342 are effectively unitized into a single ground terminal to provide a substantially similar ground potential for the circuit board 300 and the filter housing members 1, 20.

It should be noted that the position of the projected portions 227 about the periphery of the second post member 220 should be off-set from the position of the projected edges 133B of the ground post 120 by about 45°, with respect to the substantially coaxial central axes of the ground post 120 and the second post member 220. That is, if the positions of the projected portions 227 correspond to the positions of the projected edges 133B on opposite sides of the circuit board 300, it will be difficult to achieve the structural relationship shown in FIGS. 10A and 10B because the opposed projected portions 227 and projected edges 133B will effectively abut and pinch either side of the circuit board only in those abutted positions, which does not adequately provide the desired mechanical engagement with the circuit board 300. If, on the other hand, the projected edges 133B and the projected portions 227 are offset from one another by about 45°, for example, the circuit board 300 will effectively be crimped between the off-set opposing projected edged 133B and projected portions 227 in more locations about the periphery of the through hole 330 to provide better mechanical engagement and electrical contact.

Figure 5:
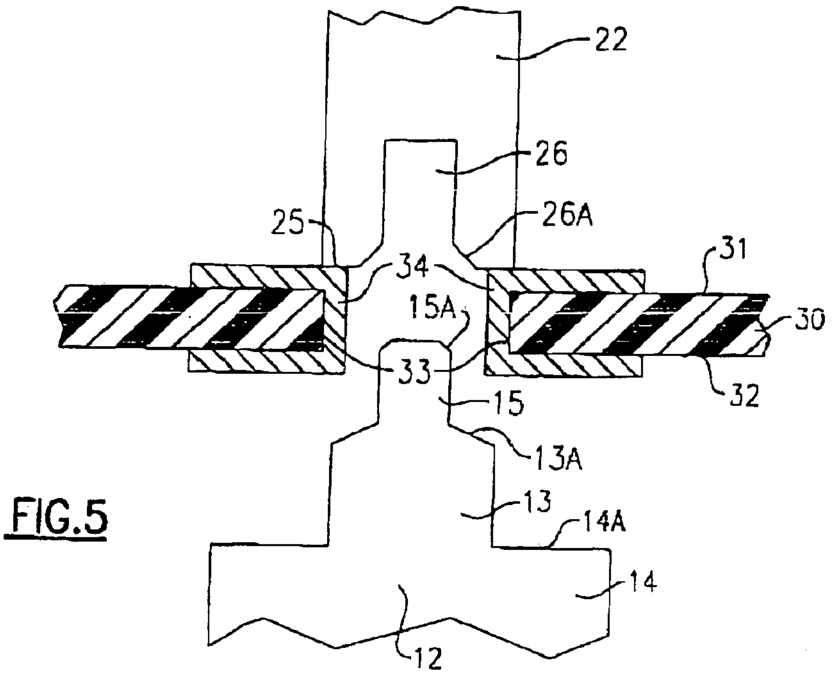
FIG. 5 is a cross-sectional view showing the relationship between the portions of the ground post, the plated ground hole in the circuit board, the terminal portion of the second post member and the recess of the second post member according to one embodiment of the present invention.

Like the embodiment shown in FIG. 5, the embodiment shown in FIGS. 10A and 10B offers a mechanical advantage over other methods of assembling split filter housings, in that the relationship between the ground post 120 and the second post member 220 provides a secure press-fit that holds the filter housing members 1, 20 together after vertical assembly is completed. Similar to the embodiment shown in FIG. 2B, during assembly, the planar portions of the terminal end 225 of the second post member 220 are positioned to be substantially flush against at least a portion of the first surface 310 (including portions of the plating 341 formed thereon proximate the through-hole 330) of the circuit board 300 such that the terminal end 225 of the second post member substantially circumscribes the through-hole 330. As mentioned above, however, the protruded portions 227 of the terminal end 225 of the second post member 220 are not flush against the plating 341, but instead engage and indent the planar surface of the plating 341 at those positions to provide sufficient electrical contact and an additional mechanical engagement with the first surface 310 of the circuit board 300, as well. The third portion 155 of the ground post 120 is securely press-fit within the recess 226 of the second post member 220, and portions of the second surface 320 of the circuit board 300 are positioned to be substantially flush against the second portion 144A of the ground post 120. As shown, the planar portion of the terminal end 225 of the second post member 220 is dimensioned to be spaced a distance from the second portion 144A of the ground post 120 by a distance that is substantially equal to the combined thickness, t', of the circuit board 300 and the thickness dimensions of the plating 341, 342, in order to facilitate the above-described mechanically secure press-fit relationship upon assembly.

It should also be noted, however, that while it is preferred to provide the projected portions 227 on the terminal end 225 of the second post member 220 as described above to provide additional structural stability (mechanical engagement) and ensure that the filter housing members 1, 20, the ground post 120, the second post member 220 and the circuit board 300 are at substantially the same ground potential, a good ground connection and secure press-fit relationship can be achieved even without the projected portions 227. In that case, while the terminal end 225 of the second post member 220 would not substantially indent the planar surface of the ground terminal 341 on the first surface 310 of the circuit board 300, the ground connection is achieved by the secure press-fit contact relationship between the ground post 120 within the recess 226 of the second post member and the contact relationship with the ground terminals 342, 341 on the circuit board 300 interposed therebetween.

As mentioned above, by providing a non-through plated through-hole in the circuit board, the expense associated with additional steps to remove solder accumulated in a plated ground hole are eliminated. Furthermore, an additional soldering step is avoided and assembly of the first and second filter housing members 1, 20 can be accomplished using Z-axis manufacturing techniques.

While the present invention has been particularly shown and described with reference to the preferred mode as illustrated in the drawings, it will be understood by one skilled in the art that various changes in detail may be effected therein without departing from the spirit and scope of the invention as defined by the claims.

We claim:

1. An electrical signal filter, comprising:

a first filter housing member extending along a longitudinal direction from a first end thereof to an opposed second end thereof, and having an inner surface terminating at first and second side surfaces that extend from said first end to said second end;

a second filter housing member extending along said longitudinal direction from a first end thereof to an opposed second end thereof, and having an inner surface terminating at first and second side surfaces that extend from said first end to said second end, said second filter housing member abutting said first filter housing member at a junction between said first and second side surfaces of said second filter housing member and said first and second side surfaces of said first filter housing member, respectively, to thereby define an internal filter cavity;

a circuit board positioned within said filter cavity, said circuit board having at least one through-hole passing from a first surface thereof to an opposed second surface thereof, said at least one through-hole being plated with a conductive substance from said first surface of said circuit board to said second surface of said circuit board to form at least one plated ground hole passing through said circuit board from said first surface to said second surface thereof; and at least one ground post extending away from said inner surface of said first filter housing member in a direction substantially perpendicular to said longitudinal direction, said at least one ground post having at least a first portion having an outer dimension that is greater than an inner diameter of said at least one plated ground hole;

wherein said circuit board is positioned within said filter cavity such that at least said first portion of said at least one ground post extends into said at least one plated ground hole to achieve secure ground contact between said circuit board and said first filter housing member in a solderless manner.

2. The electrical signal filter of claim 1, wherein said at least one ground post further comprises a second portion adjacent a first end of said first portion and having an outer dimension that is greater than said outer dimension of said first portion, and wherein at least a portion of said second surface of said circuit board contacts said second portion of said at least one ground post.

3. The electrical signal filter of claim 2, wherein said at least one ground post further comprises a third portion adjacent a second end of said first portion and having an outer dimension that is less than said outer dimension of said first portion, and wherein said third portion guides said plated ground hole in said circuit board onto said first portion of said at least one ground post.

4. The electrical signal filter of claim 1, wherein at least said first portion of said at least one ground post is polygonal or at least not substantially rounded.

5. The electrical signal filter of claim 4, wherein said first portion has a square cross-section.

6. The electrical signal filter of claim 1, further comprising two ground posts extending from opposite lateral sides of said inner surface of said first filter housing member and spaced a distance from one another in said longitudinal direction.

7. The electrical signal filter of claim 1, wherein an outer peripheral edge of said through-hole in said circuit board is spaced from an edge of said circuit board a distance substantially equal to at least one half a thickness dimension of said circuit board.

8. The electrical signal filter of claim 4, wherein at least one side of said first portion is arranged parallel to a side edge of said circuit board.

9. The electrical signal filter of claim 6, further comprising at least one shield member interposed between said two ground posts.

10. The electrical signal filter of claim 9, wherein said at least one shield member includes a surface arranged a height that is substantially the same as a height of said second portions of said ground posts to provide support for said circuit board.

11. The electrical signal filter of claim 1, wherein said at least one ground post is integrally formed with said first filter housing member.

12. The electrical signal filter of claim 11, wherein said at least one ground post is integrally cast as a part of said first filter housing member.

13. An electrical signal filter, comprising:

a first filter housing member extending along a longitudinal direction from a first end thereof to an opposed second end thereof, and having an inner surface terminating at first and second side surfaces that extend from said first end to said second end;

a second filter housing member extending along said longitudinal direction from a first end thereof to an opposed second end thereof, and having an inner surface terminating at first and second side surfaces that extend from said first end to said second end, said second filter housing member abutting said first filter housing member at a junction between said first and second side surfaces of said second filter housing member and said first and second side surfaces of said first filter housing member, respectively, to thereby define an internal filter cavity;

a circuit board positioned within said filter cavity, said circuit board having at least one through-hole passing from a first surface thereof to an opposed second surface thereof, said at least one through-hole being plated with a conductive substance from said first surface of said circuit board to said second surface of said circuit board to form at least one plated ground hole passing through said circuit board from said first surface to said second surface thereof;

at least one ground post extending away from said inner surface of said first filter housing member in a direction substantially perpendicular to said longitudinal direction, said at least one ground post having at least a first portion with an outer dimension that is greater than an inner diameter of said at least one plated ground hole; and at least one second post member extending from a first end thereof away from said inner surface of said second filter housing member toward an opposed terminal end thereof in a direction substantially perpendicular to said longitudinal direction;

wherein said circuit board is positioned within said filter cavity such that said second post member exerts a force upon said first surface of said circuit board such that at least said first portion of said at least one ground post extends into said at least one plated ground hole to achieve secure electrical grounding contact between said circuit board and said first filter housing member in a solderless manner.

14. The electrical signal filter of claim 13, wherein said at least one ground post further comprises a second portion adjacent a first end of said first portion and having an outer dimension that is greater than said outer diameter of said first portion, and wherein at least a portion of said second surface of said circuit board contacts said second portion of said at least one ground post.

15. The electrical signal filter of claim 14, wherein said at least one ground post further comprises a third portion adjacent a second end of said first portion and having an outer dimension that is less than said outer dimension of said first portion, and wherein said third portion guides said plated ground hole in said circuit board onto said first portion of said at least one ground post.

16. The electrical signal filter of claim 13, wherein at least said first portion of said at least one ground post is polygonal.

17. The electrical signal filter of claim 16, wherein said first portion has a square cross-section.

18. The electrical signal filter of claim 13, wherein an outer peripheral edge of said through-hole in said circuit board is spaced from an edge of said circuit board a distance substantially equal to at least one half a thickness dimension of said circuit board.

19. The electrical signal filter of claim 17, wherein at least two sides of said first portion are arranged parallel to at least one edge of said circuit board.

20. The electrical signal filter of claim 14, comprising two of said ground posts extending from opposite lateral sides of said inner surface of said first filter housing member and spaced a distance from one another in said longitudinal direction.

21. The electrical signal filter of claim 20, further comprising at least one shield member interposed between said two ground posts.

22. The electrical signal filter of claim 21, wherein said at least one shield member includes a surface arranged at a height that is substantially equal to a height of said second portion of each said ground post to provide support for said circuit board.

23. The electrical signal filter of claim 13, wherein said at least one ground post is integrally formed with said first filter housing member.

24. The electrical signal filter of claim 23, wherein said at least one ground post is integrally cast as a part of said first filter housing member.

25. The electrical signal filter of claim 13, wherein said at least one second post member is integrally formed with said second filter housing member.

26. The electrical signal filter of claim 25, wherein said at least one second post member is integrally cast as a part of said second filter housing member.

27. The electrical signal filter of claim 13, wherein said at least one second post member is substantially coaxial with said at least one ground post.

28. The electrical signal filter of claim 27, wherein said terminal end of said at least one second post member further comprises a recess having an inner dimension sufficient to receive a third portion of said at least one ground post in a press-fit manner.

29. The electrical signal filter of claim 13, wherein said terminal end of said at least one second post member is spaced from a second portion of said at least one ground post a distance substantially equal to a thickness dimension of said circuit board.

30. An electrical signal filter, comprising:

a first filter housing member extending along a longitudinal direction from a first end thereof to an opposed second end thereof, and having an inner surface terminating at first and second side surfaces that extend from said first end to said second end;

a second filter housing member extending along said longitudinal direction from a first end thereof to an opposed second end thereof, and having an inner surface terminating at first and second side surfaces that extend from said first end to said second end, said second filter housing member abutting said first filter housing member at a junction between said first and second side surfaces of said second filter housing member and said first and second side surfaces of said first filter housing member, respectively, to thereby define an internal filter cavity;

a circuit board positioned within said filter cavity, said circuit board having at least one through-hole passing from a first surface thereof to an opposed second surface thereof, at least a portion of said circuit board proximate said through-hole being plated with a conductive substance to form a ground terminal; and at least one ground post extending away from said inner surface of said first filter housing member in a direction substantially perpendicular to said longitudinal direction, said at least one ground post having at least a first portion having an outer dimension that is greater than an inner diameter of said at least one through-hole;

wherein said circuit board is positioned within said filter cavity such that said first portion of said at least one ground post extends into said through-hole and contacts said ground terminal to achieve secure ground contact between said circuit board and said first filter housing member in a solderless manner.

31. The electrical signal filter of claim 30, wherein said ground terminal is formed on said second surface of said circuit board.

32. The electrical signal filter of claim 30, wherein said first portion of said ground post further comprises a plurality of projected edges extending outwardly toward a second portion of said ground post.

33. The electrical signal filter of claim 32, wherein said plurality of projected edges engage a planar surface of said ground terminal to achieve a secure ground contact between said circuit board and said first filter housing member in a solderless manner.

34. An electrical signal filter, comprising:

a first filter housing member extending along a longitudinal direction from a first end thereof to an opposed second end thereof, and having an inner surface terminating at first and second side surfaces that extend from said first end to said second end;

a second filter housing member extending along said longitudinal direction from a first end thereof to an opposed second end thereof, and having an inner surface terminating at first and second side surfaces that extend from said first end to said second end, said second filter housing member abutting said first filter housing member at a junction between said first and second side surfaces of said second filter housing member and said first and second side surfaces of said first filter housing member, respectively, to thereby define an internal filter cavity;

a circuit board positioned within said filter cavity, said circuit board having at least one through-hole passing from a first surface thereof to an opposed second surface thereof, at least a portion of said circuit board proximate said through-hole being plated with a conductive substance to form a ground terminal;

at least one ground post extending away from said inner surface of said first filter housing member in a direction substantially perpendicular to said longitudinal direction, said at least one ground post having at least a first portion having an outer dimension that is greater than an inner diameter of said at least one through-hole; and at least one second post member extending from a first end thereof away from said inner surface of said second filter housing member toward an opposed terminal end thereof in a direction substantially perpendicular to said longitudinal direction;

wherein said circuit board is positioned within said filter cavity such that said first portion of said at least one ground post extends into said through-hole and contacts said ground terminal to achieve secure ground contact between said circuit board and said first filter housing member in a solderless manner.

35. The electrical signal filter of claim 34, wherein said ground terminal is formed on said first and said second surfaces of said circuit board.

36. The electrical signal filter of claim 34, wherein said first portion of said ground post further comprises a plurality of projected edges extending outwardly toward a second portion of said ground post.

37. The electrical signal filter of claim 36, wherein said plurality of projected edges engage a planar surface of said ground terminal on said second surface of said circuit board to achieve a secure ground contact between said circuit board and said first filter housing member in a solderless manner.

38. The electrical signal filter of claim 37, wherein said at least one second post member is substantially coaxial with said at least one ground post.

39. The electrical signal filter of claim 38, wherein said terminal end of said at least one second post member further comprises a recess having an inner dimension sufficient to receive a third portion of said at least one ground post in a press-fit manner.

40. The electrical signal filter of claim 39, wherein said terminal end of said at least one second post member further comprises a plurality of projected portions extending outwardly and away from said second filter housing member.

41. The electrical signal filter of claim 40, said plurality of projected portions engage a planar surface of said ground terminal on said first surface of said circuit board to achieve a secure ground contact between said circuit board, said ground post and said second filter housing member in a solderless manner.

42. An electrical signal filter, comprising:

a first filter housing member extending along a longitudinal direction from a first end thereof to an opposed second end thereof, and having an inner surface terminating at first and second side surfaces that extend from said first end to said second end;

a second filter housing member extending along said longitudinal direction from a first end thereof to an opposed second end thereof, and having an inner surface terminating at first and second side surfaces that extend from said first end to said second end, said second filter housing member abutting said first filter housing member at a junction between said first and second side surfaces of said second filter housing member and said first and second side surfaces of said first filter housing member, respectively, to thereby define an internal filter cavity;

a circuit board positioned within said filter cavity, said circuit board having at least one through-hole passing from a first surface thereof to an opposed second surface thereof, at least a portion of said first surface of said circuit board being plated with a conductive substance to form a ground terminal proximate said through-hole;

at least one ground post extending away from said inner surface of said first filter housing member in a direction substantially perpendicular to said longitudinal direction, said at least one ground post having at least a first portion having an outer dimension that is greater than an inner diameter of said at least one through-hole; and at least one second post member extending from a first end thereof away from said inner surface of said second filter housing member toward an opposed terminal end thereof in a direction substantially perpendicular to said longitudinal direction;

wherein said circuit board is positioned within said filter cavity such that said first portion of said at least one ground post extends into said through-hole and contacts said ground terminal to achieve secure ground contact between said circuit board and said first filter housing member in a solderless manner.

43. The electrical signal filter of claim 42, wherein said at least one second post member is substantially coaxial with said at least one ground post.

44. The electrical signal filter of claim 43, wherein said terminal end of said at least one second post member further comprises a recess having an inner dimension sufficient to receive a third portion of said at least one ground post in a press-fit manner.

45. The electrical signal filter of claim 44, wherein said terminal end of said at least one second post member further comprises a plurality of projected portions extending outwardly and away from said second filter housing member.

46. The electrical signal filter of claim 45, said plurality of projected portions engage a planar surface of said ground terminal on said first surface of said circuit board to achieve a secure ground contact between said circuit board, said ground post and said second filter housing member in a solderless manner.

* * * * *